United States Patent
Uedaira et al.

(10) Patent No.: US 9,989,408 B2
(45) Date of Patent: Jun. 5, 2018

(54) PHOTODETECTOR AND ELECTRONIC APPARATUS

(71) Applicant: Rohm Co., Ltd., Kyoto (JP)

(72) Inventors: Yoshitsugu Uedaira, Kyoto (JP); Takahiro Kitahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 232 days.

(21) Appl. No.: 14/963,348

(22) Filed: Dec. 9, 2015

(65) Prior Publication Data

US 2016/0169734 A1 Jun. 16, 2016

(30) Foreign Application Priority Data

Dec. 12, 2014 (JP) ................. 2014-251714

(51) Int. Cl.
*H01L 27/00* (2006.01)
*G01J 1/04* (2006.01)
*G01J 1/42* (2006.01)
*G01J 3/51* (2006.01)
*H01L 27/146* (2006.01)

(52) U.S. Cl.
CPC ........... *G01J 1/0492* (2013.01); *G01J 1/4228* (2013.01); *G01J 3/513* (2013.01); *H01L 27/14621* (2013.01); *H01L 27/14645* (2013.01); *G01J 2003/516* (2013.01)

(58) Field of Classification Search
CPC ......... H01L 27/14621; H01L 27/14645; H01L 27/14647; H01L 27/14652
USPC .................... 250/208.1, 214.1, 226; 257/432
See application file for complete search history.

(56) References Cited

U.S. PATENT DOCUMENTS

| | | | |
|---|---|---|---|
| 5,648,653 A * | 7/1997 | Sakamoto | H01L 27/14618 250/208.1 |
| 8,274,051 B1 | 9/2012 | Aswell et al. | |
| 2003/0193586 A1 * | 10/2003 | Hayakawa | H01L 27/14647 348/272 |

* cited by examiner

*Primary Examiner* — Kevin Pyo
(74) *Attorney, Agent, or Firm* — Fish & Richardson P.C.

(57) ABSTRACT

A photodetector includes a semiconductor substrate; a light receiving part for signal detection and an infrared light receiving part which are formed in the semiconductor substrate and are covered at least by first color filters having a common color; and second color filters which overlap with the first color filters on the infrared light receiving part and are configured to block light in a wavelength range transmitting through the first color filters.

15 Claims, 10 Drawing Sheets

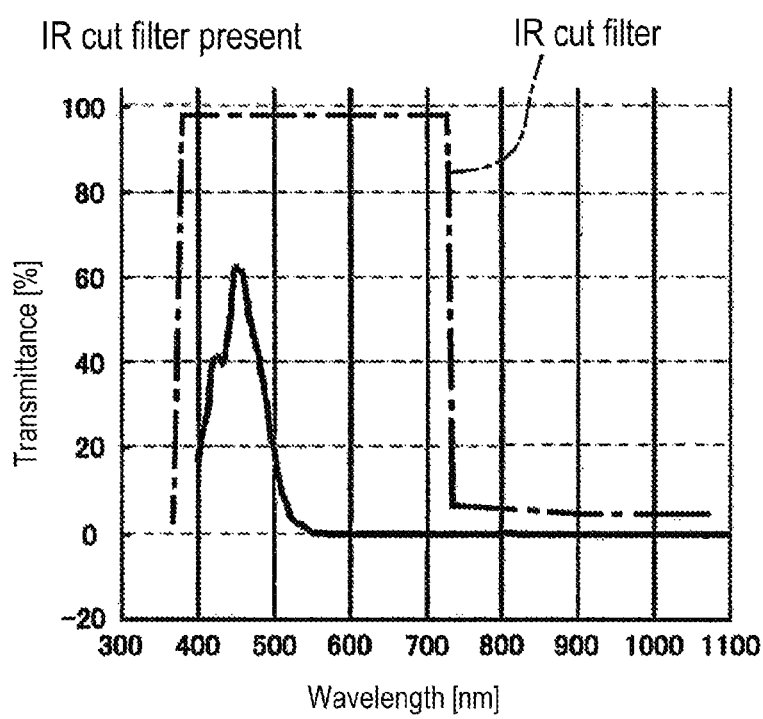

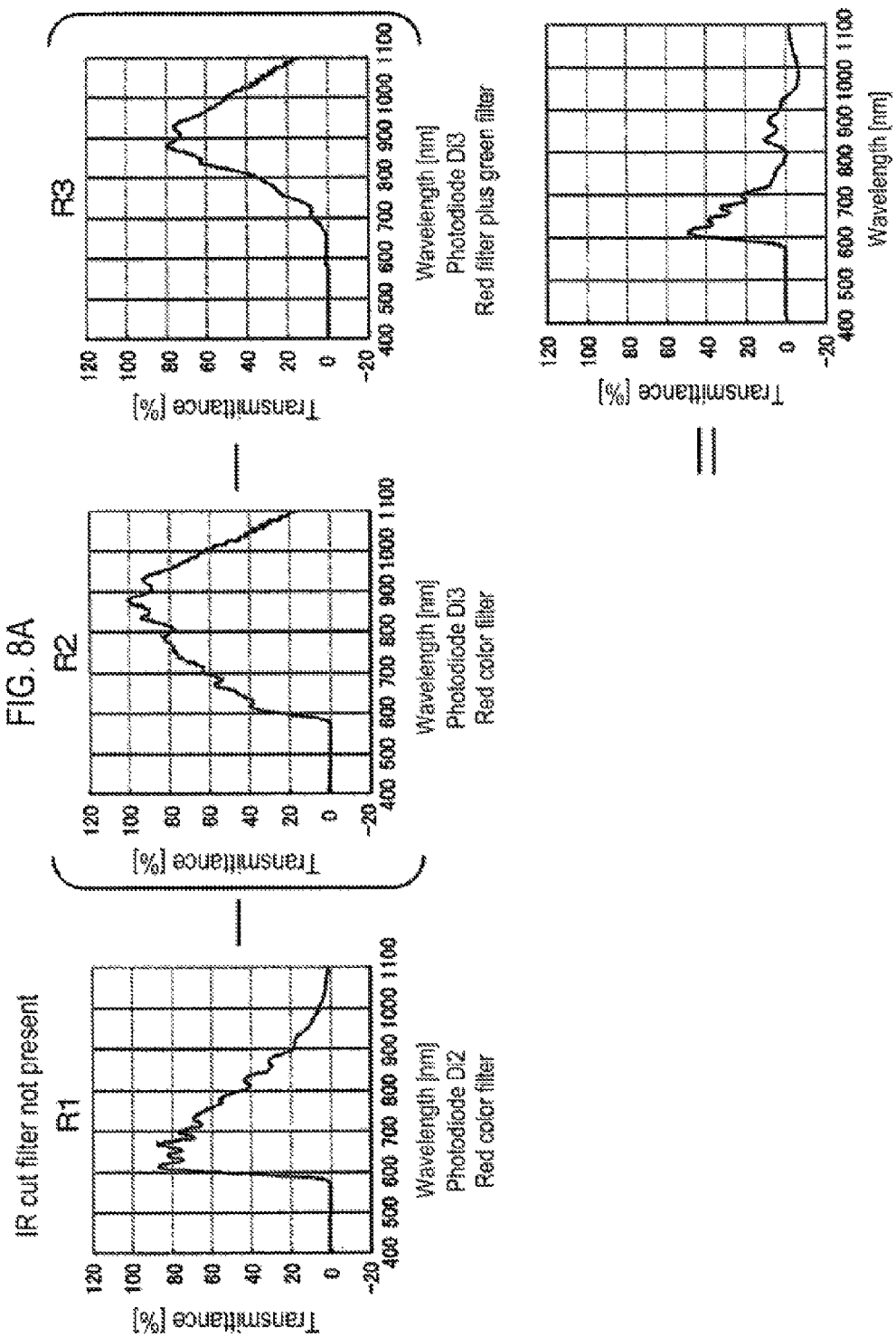

PHOTODETECTOR AND ELECTRONIC APPARATUS

CROSS-REFERENCE TO RELATED APPLICATIONS

This application is based upon and claims the benefit of priority from Japanese Patent Application No. 2014-251714, filed on Dec. 12, 2014, the entire contents of which are incorporated herein by reference.

TECHNICAL FIELD

The present disclosure relates to a photodetector including color filters, and an electronic apparatus including the same.

BACKGROUND

Infrared cut filters can be used to separate an infrared component from light incident into a color sensor. For example, a photo-electronic sensor includes a substrate in which a plurality of sensors is formed, an infrared light cut filter covering the sensors on the substrate, and a visible light filter formed on the infrared light cut filter. The infrared light cut filter is constituted by a multi-layered film formed by laminating about 50 dielectric layers.

However, since the multi-layered infrared light cut filter is designed on the assumption that light is incident perpendicular to the filter, it is difficult to completely separate an infrared component from light incident in an oblique direction.

SUMMARY

The present disclosure provides some embodiments of a photodetector which is capable of advantageously reducing the sensitivity of an infrared wavelength range. The present disclosure provides some embodiments of an electronic apparatus including a photodetector which is capable of advantageously reducing the sensitivity of an infrared wavelength range.

According to one embodiment of the present disclosure, there is provided a photodetector including: a semiconductor substrate; a light receiving part for signal detection and an infrared light receiving part which are formed in the semiconductor substrate and are covered at least by first color filters having the common color; and second color filters which overlap with the first color filters on the infrared light receiving part and are configured to block light in a wavelength range transmitting through the first color filters.

With this configuration, of the light receiving part for signal detection and the infrared light receiving part which are covered by the first color filters having the common color, only the infrared light receiving part is selectively covered by the second color filters. Thus, when the same light is incident into the light receiving part for signal detection and the infrared light receiving part, visible light in a predetermined wavelength range and infrared light are detected in the light receiving part for signal detection. On the other hand, the visible light is selectively blocked in the second color filters and only infrared light having the same level as the infrared light detected in the light receiving part for signal detection can be detected in the infrared light receiving part. Therefore, by selectively excluding or attenuating an infrared wavelength range from an output signal of the light receiving part for signal detection based on the magnitude of an output signal of the infrared light receiving part by means of a logic circuit or the like provided in the inside or outside of the photodetector, an output signal (information) close to the actual visible light component of the incident light can be obtained. As a result, it is possible to calculate illuminance and color temperature accurately with a smaller error by using the photodetector according to the embodiment of the present disclosure.

In addition, since such signal separation process separates only a signal in an infrared wavelength range by a logical operation, it is possible to advantageously reduce the sensitivity of the infrared wavelength range irrespective of the incident direction of light.

In one embodiment of the present disclosure, each of the light receiving part for signal detection and the infrared light receiving part includes a first pn junction located at the same depth from the surface of the semiconductor substrate and a second pn junction located to be deeper than the first pn junction.

There is the effect that a longer light wavelength provides a deeper light transmission depth in a semiconductor substrate. Therefore, it is possible to detect the light with high efficiency by selectively using the pn junction depending on a wavelength of light to be detected. In one embodiment of the present disclosure, the first color filters include blue color filters or green color filters and the second color filters include red color filters.

The spectral sensitivity curve of light transmitting through the blue color filters or the green color filters has separate peaks for a blue or green color wavelength range and an infrared wavelength range. Therefore, when a mountain shaped curve having a peak in the blue or green color wavelength range is separated from the spectral sensitivity curve having these separate peaks, there is apparently left a mountain shaped curve which may be regarded to be derived from the infrared light. In other words, with this configuration, when light of the blue or green color wavelength range is separated in the red color filters in the infrared light receiving part, the infrared light can be easily determined.

In one embodiment of the present disclosure, the first color filters include red color filters and the second color filters include blue color filters or green color filters. In this case, each of the light receiving part for signal detection and the infrared light receiving part may include a first pn junction located at the same depth from the surface of the semiconductor substrate and a second pn junction located to be deeper than the first pn junction.

Unlike the light transmitting through the above-described blue color filter or the green color filter, the spectral sensitivity curve of light transmitting through the red color filter does not apparently have separate peaks for a red color wavelength range and an infrared wavelength range. Therefore, in the infrared light receiving part, it is difficult to selectively determine the infrared light when just using the blue color filter or the green color filter to separate the red light. For the purpose of avoiding this problem, this configuration uses the effect that a longer light wavelength provides a deeper light transmission depth in the semiconductor substrate. In other words, in the light receiving part for signal detection, the red light is mainly detected in the first pn junction which is formed at a relatively shallow position and is suitable for detection of the red light having the wavelength shorter than that of the infrared light. On the other hand, in the infrared light receiving part, infrared light can be detected in the second pn junction which is formed at a relatively deep position and is suitable for detection of the infrared light having the wavelength longer than that of the red light. Thus, the infrared light can be selectively determined with ease.

In one embodiment of the present disclosure, the light receiving part for signal detection is disposed at positions which are in point symmetry with respect to the center of a light receiving region on the semiconductor substrate. With this configuration, even when light is not sufficiently incident into some light receiving parts for signal detection for such a reason that the light does not uniformly hit the entire light receiving region of the semiconductor substrate, the light can be detected in other light receiving parts for signal detection, which can provide high reliability.

In one embodiment of the present disclosure, the photodetector further includes an infrared light cut filter configured to cover the light receiving part for signal detection and the infrared light receiving part. With this configuration, it is possible to more reliably reduce the sensitivity of the infrared wavelength range. In one embodiment of the present disclosure, each of the first color filters includes a color resist.

According to another embodiment of the present disclosure, there is provided an electronic apparatus including: a photodetector including a semiconductor substrate; a light receiving part for signal detection and an infrared light receiving part which are formed in the semiconductor substrate and are covered at least by first color filters having the common color; and second color filters which overlap with the first color filters on the infrared light receiving part and are configured to block light in a wavelength range transmitting through the first color filters; and a housing configured to accommodate the photodetector.

With this configuration, since the electronic apparatus includes the photodetector capable of advantageously reducing the sensitivity of an infrared wavelength range, it is possible to provide a lens window for light reception which is formed in the electronic apparatus and has a practicable low visible light transmittance. As a result, it is possible to extend a degree of freedom of design of the lens window.

BRIEF DESCRIPTION OF THE DRAWINGS

FIG. 6B is a diagram showing the final spectral sensitivity characteristics in the blue light receiving part.

FIG. 8A is a diagram for explaining an infrared light separation operation in a red light receiving part.

DETAILED DESCRIPTION

Figure 1:
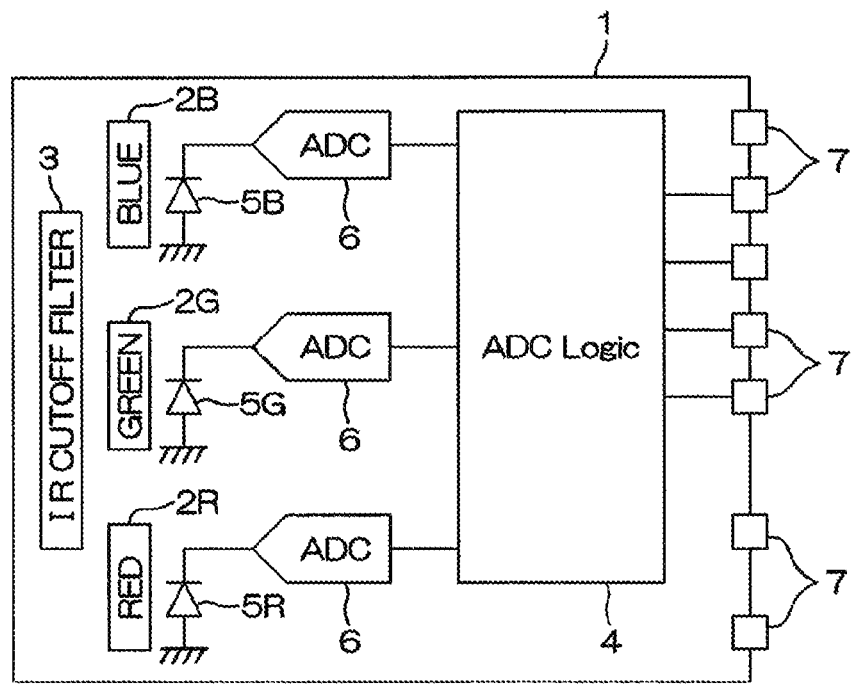
FIG. 1 is an exemplary block diagram showing the electrical configuration of a photodetector, according to one embodiment of the present disclosure.

An embodiment of the present disclosure will now be described in detail with reference to the accompanying drawings. FIG. 1 is an exemplary block diagram showing the electrical configuration of a photodetector 1, according to one embodiment of the present disclosure. The photodetector 1 includes a red light receiving part 2R, a green light receiving part 2G, a blue light receiving part 2B, an infrared light cut filter 3 covering these light receiving parts 2R, 2G and 2B, and an arithmetic operation part 4.

The red light receiving part 2R, the green light receiving part 2G and the blue light receiving part 2B include photodiodes 5R, 5G and 5B, respectively. The photodiodes 5R, 5G and 5B are electrically connected to the arithmetic operation part 4. Analog/Digital Converters (ADCs) 6 are interposed between the arithmetic operation part 4 and the photodiodes 5R, 5G and 5B. When light is incident into a pn junction portion of each of the photodiodes 5R, 5G and 5B, a current is generated due to a photovoltaic effect and is converted from an analog signal to a digital signal in the ADCs 6, which is then input to the arithmetic operation part 4. The arithmetic operation part 4 performs arithmetic processing based on the input digital signal.

The arithmetic operation part 4 is an integrated circuit such as an LSI (Large Scale Integration) or the like and includes various circuit elements such as transistors, capacitors, registers or the like. The arithmetic operation part 4 is electrically connected to a plurality of external electrodes 7 formed on the outermost surface of the photodetector 1. Signal output from the arithmetic operation part 4 and power input to the arithmetic operation part 4 and the photodiodes 5R, 5G and 5B are performed through the plurality of external electrodes 7.

Figure 2:
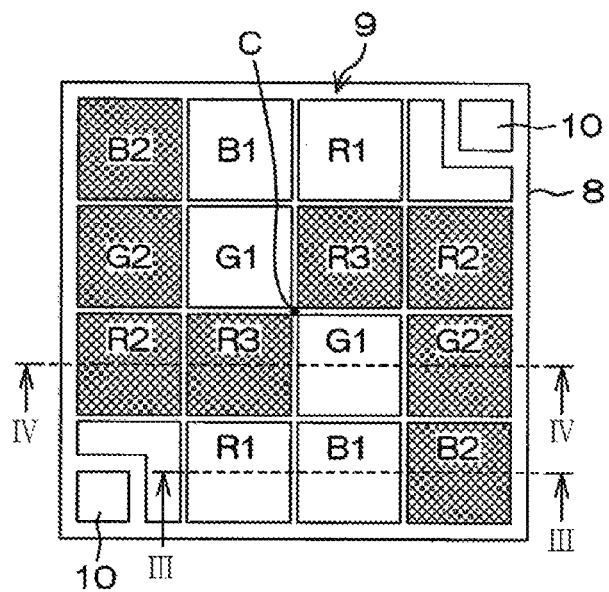
FIG. 2 is a layout view of a light receiving region of the photodetector.

FIG. 2 is a layout view of a light receiving region 9 of the photodetector 1. The photodetector 1 includes a semiconductor substrate 8 and a light receiving region 9 formed on the semiconductor substrate 8. The red light receiving part 2R, the green light receiving part 2G and the blue light receiving part 2B have their respective light receiving portions which are arrayed in the light receiving region 9. Specifically, the red light receiving part 2R includes a light receiving portion R1 for signal detection and infrared light receiving portions R2 and R3, the green light receiving part 2G includes a light receiving portion G1 for signal detection and an infrared light receiving portion G2, and the blue light receiving part 2B includes a light receiving portion B1 for signal detection and an infrared light receiving portion B2. The light receiving portions R1, G1 and B1 for signal detection and the infrared receiving portions R2, R3, G2 and B2 are provided in the plural. Among these light receiving portions, at least some light receiving portions R1, G1 and B1 for signal detection are disposed at positions which are in point symmetry with respect to the center C (i.e., the center of gravity) of the light receiving region 9 which has a square shape when viewed from the top. Similarly, the plurality of infrared light receiving portions R2, R3, G2 and B2 may be disposed at point-symmetrical positions, as shown in FIG. 2. Accordingly, even when light is not sufficiently incident into some light receiving portions R1, G1 and B1 for signal detection for such a reason that the light does not uniformly hit the entire light receiving region 9 of the semiconductor substrate 8, the light can be detected in other light receiving portions R1, G1 and B1 for signal detection, which can provide high reliability. For example, even when the incidence of light into a lower side edge of the light receiving region 9 is insufficient and the light cannot be well detected in light receiving portions R1 and B1 for signal detection on the lower side edge, the light can be detected in light receiving portions R1 and B1 for signal detection on an upper side edge of the light receiving region 9.

In FIG. 2, for the purpose of clarity, the reference numerals of the red light receiving part 2R, green light receiving part 2G and blue light receiving part 2B are not shown, and the light receiving portions R1, G1 and B1 for signal detection are indicated by a square in white, and the infrared light receiving portions R2, R3, G2 and B2 are indicated by a square in cross-hatch. A clear light receiving portion 10 capable of receiving visible light and infrared light is formed in a corner of the light receiving region 9 which has a square shape when viewed from the top. For example, the clear light receiving portion 10 may be disposed one by one in at least one pair of diagonal corners of the light receiving region 9 when viewed from the top. The clear light receiving portion 10 includes a photodiode and is not covered by the infrared light cut filter 3 (see FIG. 1).

Figure 3:
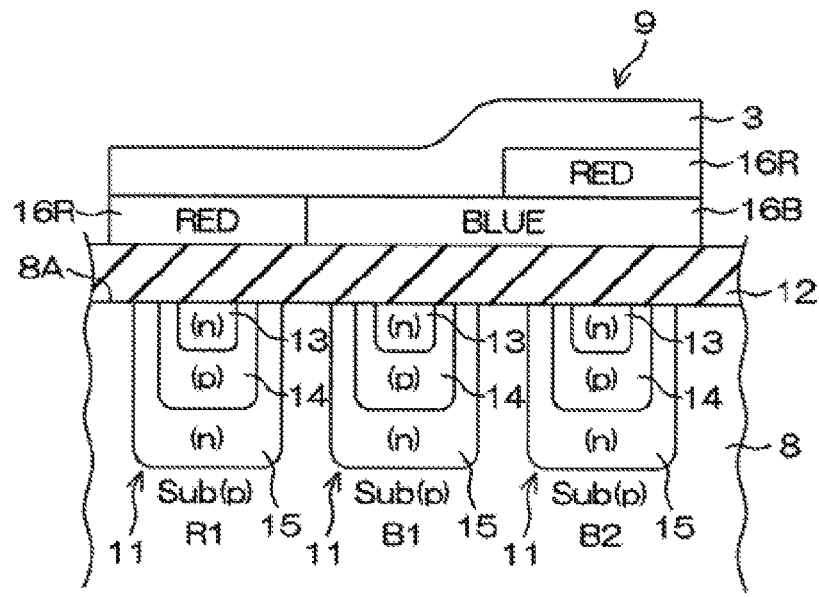
FIG. 3 is a sectional view of the photodetector, which is taken along line in III-III FIG. 2.
Figure 4:
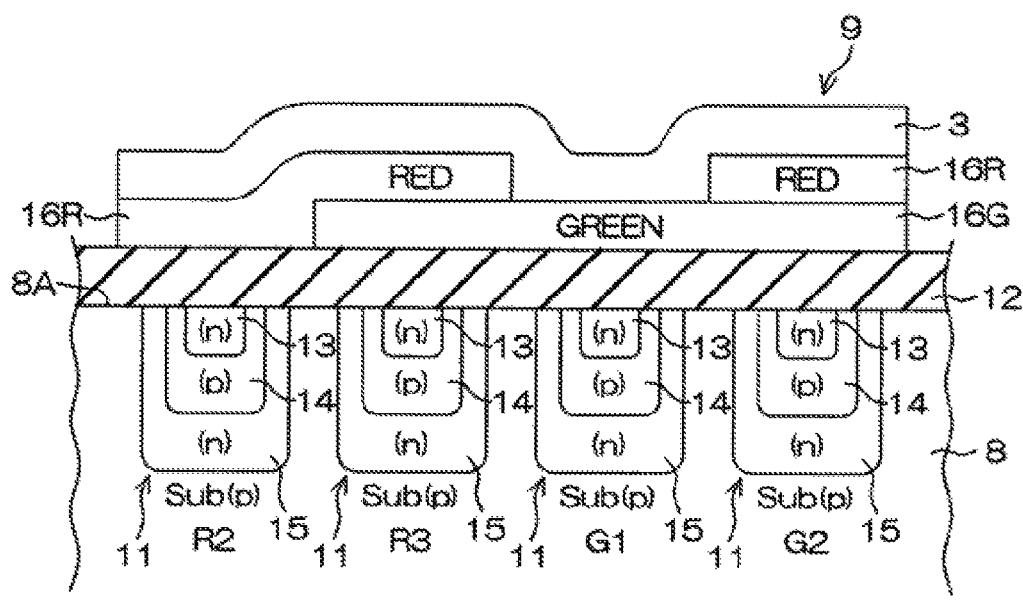
FIG. 4 is a sectional view of the photodetector, which is taken along line IV-IV in FIG. 2.
Figure 5:
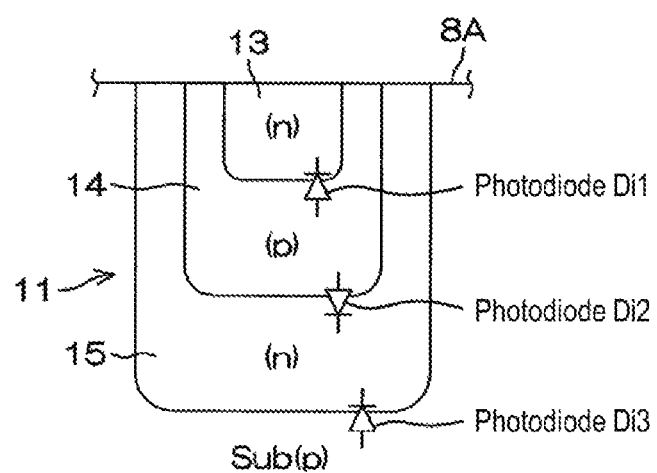
FIG. 5 is an enlarged view of a photodiode shown in FIGS. 3 and 4.

Next, sectional structures of the light receiving portions R1, G1 and B1 and infrared light receiving portions R2, R3, G2 and B2 will be described with reference to FIGS. 3 to 5. FIG. 3 is a sectional view of the photodetector 1, which is taken along line in FIG. 2. FIG. 4 is a sectional view of the photodetector 1, which is taken along line Iv-Iv in FIG. 2. FIG. 5 is an enlarged view of a photodiode shown in FIGS. 3 and 4.

The light receiving portions R1, G1 and B1 and the infrared light receiving portions R2, R3, G2 and B2 include, as common elements, the semiconductor substrate 8, photodiodes 11 formed on the semiconductor substrate 8, and an interlayer insulating film 12 covering the entire surface of the semiconductor substrate 8. The photodiodes 11 correspond to the photodiodes 5R, 5G and 5B shown in FIG. 1, respectively. For the purpose of clarity, the reference numerals of the photodiodes 5R, 5G and 5B are not shown in FIGS. 3 to 5.

In this embodiment, the semiconductor substrate 8 is a p-type silicon substrate. Each photodiode 11 has an npnp structure constituted by a first n-type region 13, a first p-type region 14, a second n-type region 15 and the p-type semiconductor substrate 8 which are formed in this order from the surface 8A of the p-type semiconductor substrate 8. The second n-type region 15 is formed in the surface of the p-type semiconductor substrate 8, the first p-type region 14 is formed in the inner region of the second n-type region 15, and the first n-type region 13 is formed in the inner region of the first p-type region 14. As a result, as shown in FIG. 5, each of the photodiodes 11 has a photodiode Di1, a photodiode Di2 and a photodiode Di3 including their respective pn junctions having different depths from the surface 8A of the semiconductor substrate 8.

The photodiode Di1 includes a pn junction between the first p-type region 14 and the first n-type region 13 and the depth of this pn junction from the surface 8A is, for example, 0.09 μm to 0.17 μm. The photodiode Di2 includes a pn junction between the first p-type region 14 and the second n-type region 15 and the depth of this pn junction from the surface 8A is, for example, 1.0 μm to 1.8 μm, which is deeper than the pn junction of the photodiode Di1. The photodiode Di3 includes a pn junction between the p-type semiconductor substrate 8 and the second n-type region 15 and the depth of this pn junction from the surface 8A is, for example, 3.2 μm to 5.9 μm, which is deeper than the pn junction of the photodiode Di2.

The photodiode 11 including the photodiodes Di1 to Di3 having different depths has the following advantages. The silicon substrate has a tendency that a longer light wavelength provides a deeper light transmission depth. If there are more than one wavelength ranges of light components to be detected, like the photodetector 1, light can be efficiently detected in any of the photodiodes Di1 to Di3. For example, the photodiode Di1 is suitable for detection of components of a blue wavelength range (for example, 420 nm to 480 nm) and a green wavelength range (for example, 500 nm to 560 nm), the photodiode Di2 is suitable for detection of components of the green wavelength range and a red wavelength range (for example, 590 nm to 680 nm), and the photodiode Di3 is suitable for detection of components of an infrared wavelength range (for example, 700 nm to 1300 nm).

In addition to the photodiodes 11, an impurity region of transistors constituting the arithmetic operation part 4 may be formed in the semiconductor substrate 8. In this case, the first n-type region 13, the first p-type region 14 and the second n-type region 15 may be formed in the same process as the impurity region such as a source region (S), a drain region (D), a buried layer for element isolation (L/I, B/L), and so on, which constitute a transistor.

The interlayer insulating film 12 is made of insulating material such as silicon oxide ($SiO_2$). The interlayer insulating film 12 may be a single layer, as shown in FIGS. 3 and 4, or a multi-layer. A red color filter 16R, a green color filter 16G and a blue color filter 16B are formed on the interlayer insulating film 12 and the infrared light cut filter 3 is formed to cover these filters 16R, 16G and 16B. The infrared light cut filter 3 may be formed with a multi-layer dielectric film including a plurality of layered (for example, about 50 layers of) $SiO_2/TiO_2$ structures. The infrared light cut filter 3 is a coating film common to all of the light receiving portions for signal detection and infrared light receiving portions R2, R3, G2 and B2. The red color filter 16R, the green color filter 16G and the blue color filter 16B may be a pigment-based color resist, a transparent resist formed using a nanoimprint technique, a gelatin film or the like.

Although whether to provide the red color filter 16R, the green color filter 16G and the blue color filter 16B depends on the type of an underlying light receiving portion, color filters of a common color have to be provided for a light receiving portion for detecting light of the same color. That is, the red color filter 16R has to be provided for the light receiving portion R1 for red light detection and the infrared light receiving portions R2 and R3, the green color filter 16G has to be provided for the light receiving portion G1 for green light detection and the infrared light receiving portion G2, and the blue color filter 16B has to be provided for the light receiving portion B1 for blue light detection and the infrared light receiving portion B2.

In more detail on the arrangement of the color filters 16R, 16G and 16B, a single-layered film of the red color filter 16R is provided for the light receiving portion R1 for signal detection, a single-layered film of the red color filter 16R is provided for the infrared light receiving portion R2, and a multi-layered film of the red color filter 16R and green color filter 16G (16R corresponding to the upper layer) is provided for the infrared light receiving portion R3. In addition, a single-layered film of the green color filter 16G is provided for the light receiving portion G1 for signal detection and a multi-layered film of the red color filter 16R and green color filter 16G (16R corresponding to the upper layer) is provided for the infrared light receiving portion G2. Further, a single-layered film of the blue color filter 16B is provided for the light receiving portion B1 for signal detection and a multi-layered film of the red color filter 16R and blue color filter 16B (16R corresponding to the upper layer) is provided for the infrared light receiving portion B2.

Next, spectral sensitivity characteristics obtained by the operation of infrared separation in the red light receiving part 2R, the green light receiving part 2G and the blue light receiving part 2B will be individually described.

(1) Blue Characteristics

With respect to the blue light receiving part 2B, first, when light is incident into the light receiving portion B1 for signal detection and the infrared light receiving portion B2, blue light and infrared light are detected in the photodiode Di1 of the light receiving portion B1 for signal detection. On the other hand, blue light is selectively blocked in the red color filter 16R and only infrared light having the same level as the infrared light detected in the light receiving portion B1 for signal detection is detected in the photodiode Di1 of the infrared light receiving portion B2. The spectral sensitivity characteristics at that time have curves as shown in the left and middle sides of FIG. 6A. A signal of the magnitude in response to the detection of the blue light and the infrared light is input from the light receiving portion B1 for signal detection to the arithmetic operation part 4. Then, by selectively excluding or attenuating an infrared wavelength range from an output signal of the light receiving portion B1 for signal detection based on the magnitude of an output signal of the infrared light receiving portion B2 (B1−B2), an output signal (information) close to the actual blue light component of the incident light can be obtained. The spectral sensitivity characteristics obtained by such signal separation process have a curve as shown in the right side of FIG. 6A. In this embodiment, further, since some of the infrared light is filtered (separated) by the infrared light cut filter 3, the spectral sensitivity curve as shown in FIG. 6B is finally obtained.

Figure 6A:
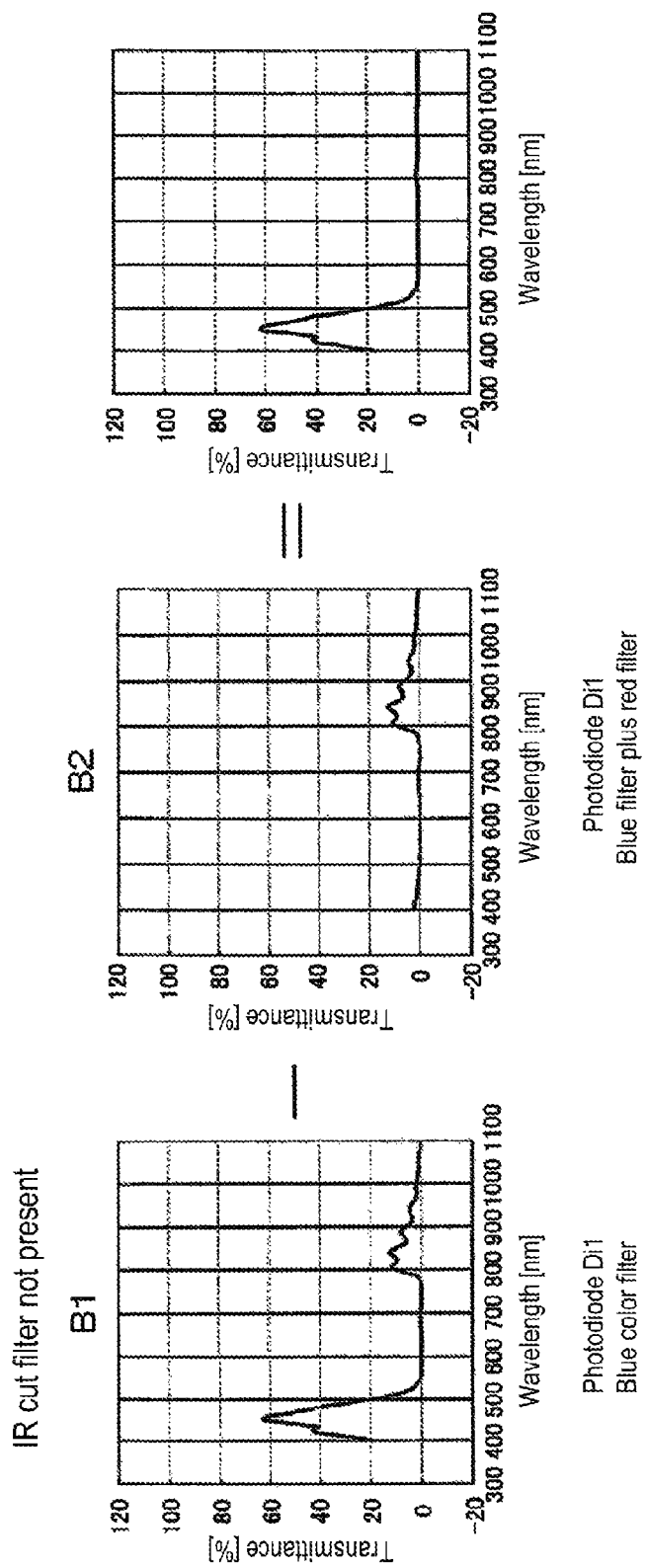
FIG. 6A is a diagram for explaining an infrared light separation operation in a blue light receiving part.

As is apparent from FIG. 6A, the spectral sensitivity curve of light transmitting through the single-layered film of the blue color filter 16B in the light receiving portion B1 for signal detection has separate peaks for a blue color wavelength range and an infrared wavelength range. Therefore, when a mountain shaped curve having a peak in the blue color wavelength range is separated from the spectral sensitivity curve having these separate peaks, there is apparently left a mountain shaped curve which may be regarded to be derived from the infrared light. In other words, according to this embodiment, when light of the blue color wavelength range is separated in the red color filter 16R in the infrared light receiving portion B2, the infrared light can be easily determined as indicated by the spectral sensitivity curve of the infrared light receiving portion B2 in FIG. 6A.

(2) Green Characteristics

With respect to the green light receiving part 2G, first, when light is incident into the light receiving portion G1 for signal detection and the infrared light receiving portion G2, green light and infrared light are detected in the photodiodes Di1 and Di2 of the light receiving portion G1 for signal detection. On the other hand, green light is selectively blocked in the red color filter 16R and only infrared light having the same level as the infrared light detected in the light receiving portion G1 for signal detection is detected in the photodiodes Di1 and Di2 of the infrared light receiving portion G2. The spectral sensitivity characteristics at that time have curves as shown in the left and middle sides of FIG. 7A. A signal of the magnitude in response to the detection of the green light and the infrared light is input from the light receiving portion G1 for signal detection to the arithmetic operation part 4. Then, by selectively excluding or attenuating an infrared wavelength range from an output signal of the light receiving portion B1 for signal detection based on the magnitude of an output signal of the infrared light receiving portion G2 (G1−G2), an output signal (information) close to the actual blue light component of the incident light can be obtained. The spectral sensitivity characteristics obtained by such signal separation process have a curve as shown in the right side of FIG. 7A. In this embodiment, further, since some of the infrared light is filtered (separated) by the infrared light cut filter 3, the spectral sensitivity curve as shown in FIG. 7B is finally obtained.

Figure 7A:
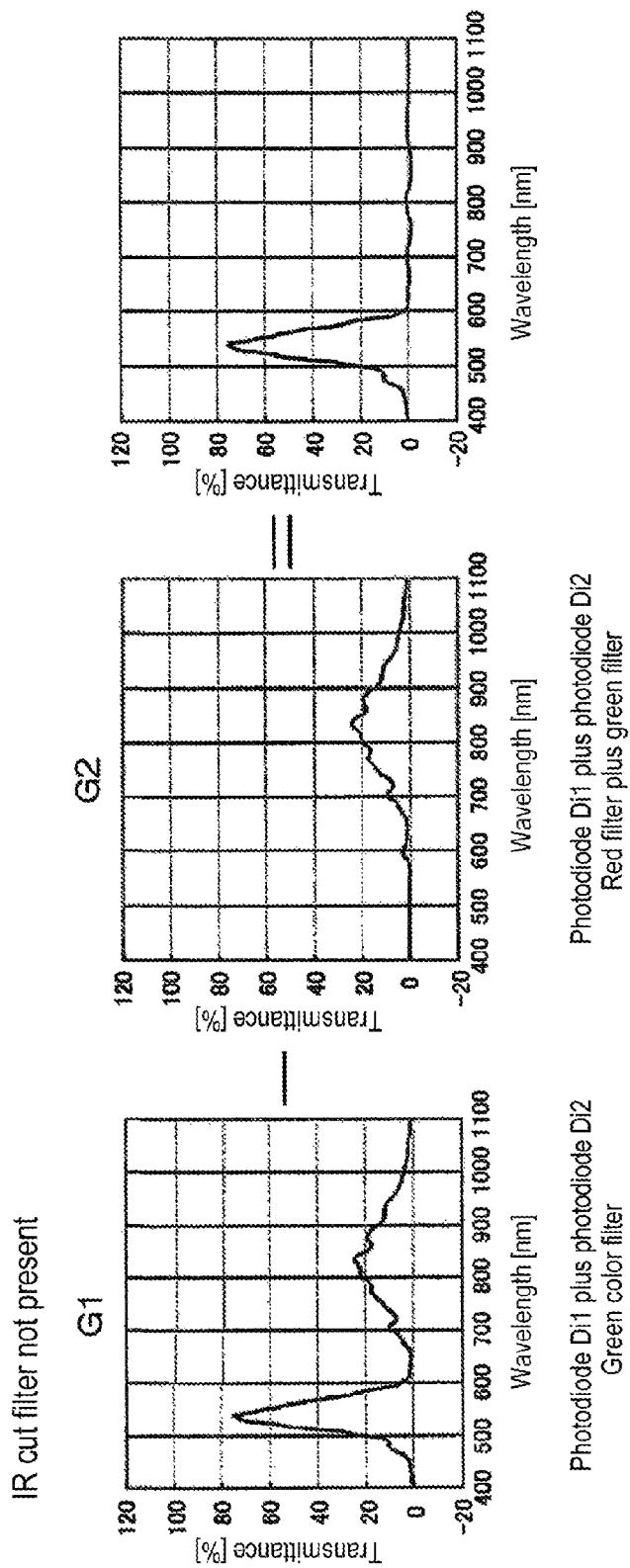
FIG. 7A is a diagram for explaining an infrared light separation operation in a green light receiving part.
Figure 7B:
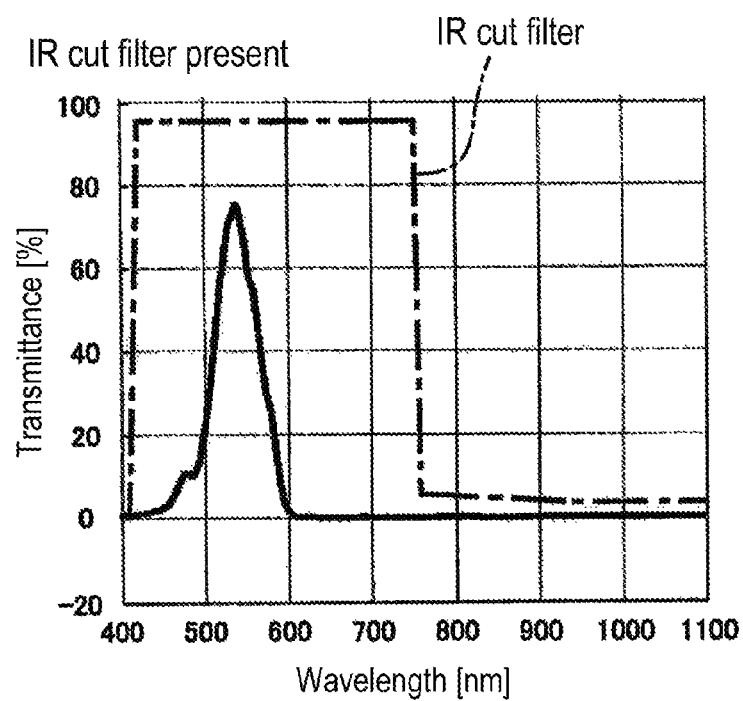
FIG. 7B is a diagram showing the final spectral sensitivity characteristics in the green light receiving part.

As is apparent from FIG. 7A, the spectral sensitivity curve of light transmitting through the single-layered film of the green color filter 16G in the light receiving portion G1 for signal detection has separate peaks for a green color wavelength range and an infrared wavelength range. Therefore, when a mountain shaped curve having a peak in the green color wavelength range is separated from the spectral sensitivity curve having these separate peaks, there is apparently left a mountain shaped curve which may be regarded to be derived from the infrared light. In other words, according to this embodiment, when light of the green color wavelength range is separated in the red color filter 16R in the infrared light receiving portion G2, the infrared light can be easily determined as indicated by the spectral sensitivity curve of the infrared light receiving portion G2 in FIG. 7A.

(3) Red Characteristics

With respect to the red light receiving part 2R, unlike the above-described blue light receiving part 2B and green light receiving part 2G, the spectral sensitivity curve of light transmitting through the single-layered film of the red color filter 16R in the light receiving portion R1 for signal detection does not have separate peaks for a red color wavelength range and an infrared wavelength range, as shown in the left side of FIG. 8A. Therefore, in the infrared light receiving portions R2 and R3, it is difficult to selectively determine the infrared light when just using the blue color filter 16B or the green color filter 16G to separate the red light. For the purpose of avoiding this problem, this embodiment uses the effect that a longer light wavelength provides a deeper light transmission depth in the semiconductor substrate 8.

In other words, as shown in FIG. 8A, in the light receiving portion R1 for signal detection, red light is mainly detected in the photodiode Di2 formed at a relatively shallow position. Therefore, it is possible to advantageously detect the red light having a wavelength shorter than that of the infrared light in the photodiode Di2.

Figure 8B:
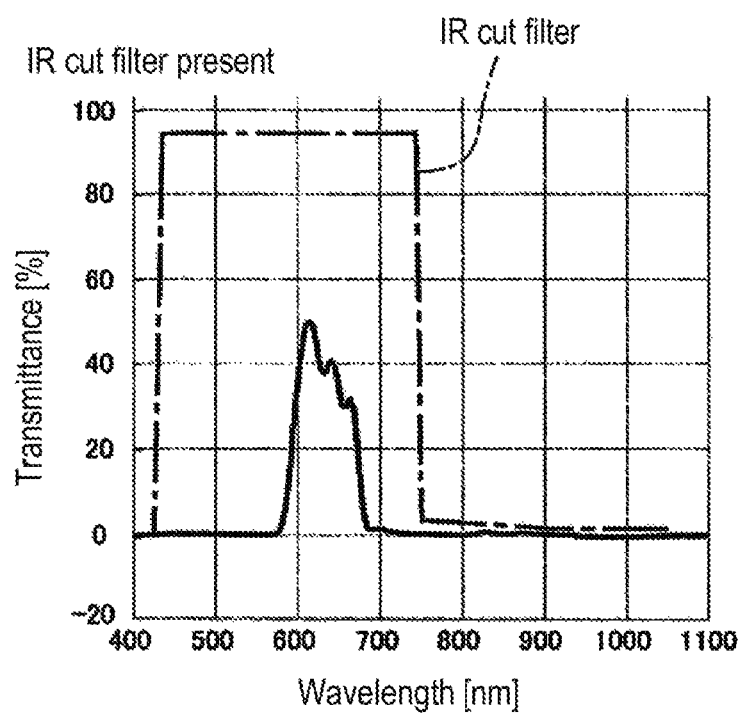
FIG. 8B is a diagram showing the final spectral sensitivity characteristics in the red light receiving part.

In the meantime, the infrared light receiving portions R2 and R3 produce spectral characteristics close to the infrared band of the light receiving portion R1 for signal detection. Specifically, red light and infrared light are detected in the photodiode Di3 of the infrared light receiving portion R2. On the other hand, the red light is selectively blocked in the green color filter 16G and only infrared light having the same level as the infrared light detected in the light receiving portion R1 for signal detection is detected in the photodiode Di3 of the infrared light receiving portion R3. The detection of the infrared light having the same level as the infrared light detected in the light receiving portion R1 for signal detection can be achieved by setting the area of the infrared light receiving portion R3 to be smaller slightly (by about 10% to 20%) than that of the infrared light receiving portion R2 and changing the material of the color filter. Then, by selectively excluding or attenuating an infrared wavelength range from an output signal of the light receiving portion R1 for signal detection based on the information obtained by a combination of the infrared light receiving portion R2 and the infrared light receiving portion R3 (R1−(R2−R3)), an output signal (information) close to the actual red light component of the incident light can be obtained. The spectral sensitivity characteristics obtained by such signal separation process have a curve as shown in the bottom of FIG. 8A. In this embodiment, further, since some of the infrared light is filtered (separated) by the infrared light cut filter 3, the spectral sensitivity curve as shown in FIG. 8B is finally obtained.

Figure 9:
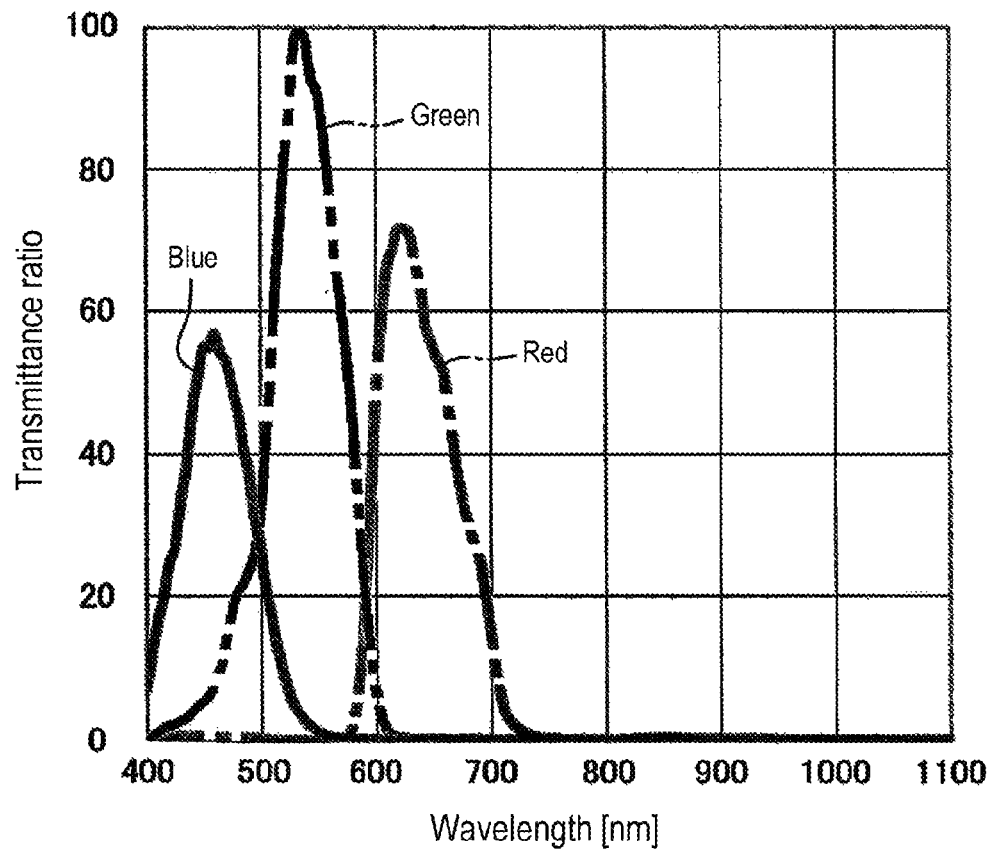
FIG. 9 is a diagram showing the final spectral sensitivity characteristics of the photodetector.

From the above, since the sensitivity of the infrared wavelength range in each of the light receiving parts 2R, 2G and 2B is reduced by the above-described arithmetic processing, the spectral sensitivity characteristics of the photodetector 1 are obtained as shown in FIG. 9. As is apparent from FIG. 9, the sensitivity of the infrared wavelength range can be reduced to a value close substantially to zero. As a result, it is possible to calculate illuminance and color temperature accurately with a smaller error by using the photodetector 1 according to this embodiment.

The photodetector 1 can be applied to not only the color sensor but also other light sensors such as an illuminance sensor, a proximity sensor and so on. Further, such light sensors can be equipped in a smartphone, a mobile phone, a digital camera, a car navigator, a notebook computer, a tablet PC and so on. Specifically, an application of the photodetector 1 to a smartphone will be described below.

Figure 10:
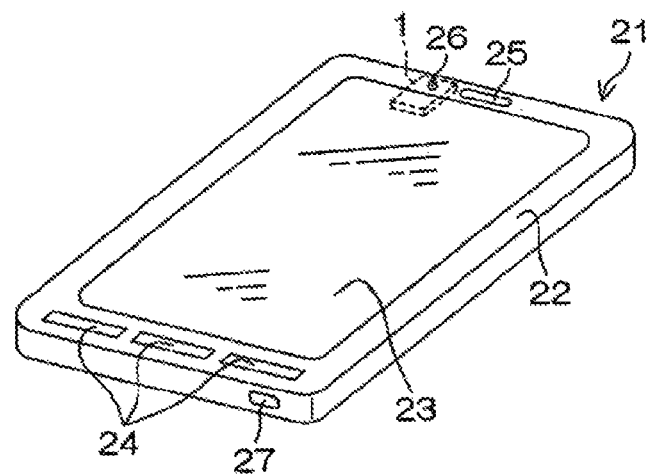
FIG. 10 is a perspective view showing the external appearance of a smartphone which is one example of an electronic apparatus to which the photodetector is applied.

FIG. 10 is a perspective view showing the external appearance of a smartphone 21 which is one example of an electronic apparatus to which the photodetector 1 is applied. The smartphone 21 is configured to accommodate electronic parts in a flat rectangular housing 22. The housing 22 has a pair of rectangular main surfaces which are formed in its front and rear sides and bonded to four lateral sides. A display surface of a display panel 23 such as a liquid crystal panel, an organic EL panel or the like is exposed to one of the main surfaces of the housing 22. The display surface of the display panel 23 forms a touch panel which provides an input interface to users.

The display panel 23 is formed in a rectangular shape occupying most of the main surface of the housing 22. A plurality of operation buttons 24 is arranged along one short lateral side of the display panel 23. In this embodiment, three operation buttons 24 are arranged along the short lateral side of the display panel 23. A user can manipulate the operation buttons 24 and the touch panel to perform the operation of the smartphone 21 to call and execute required functions.

A speaker 25 is disposed near the other short lateral side of the display panel 23. The speaker 25 provides voice sounds during a telephone call and is also used as a sounding unit for reproducing music data and so on. A lens window 26 is disposed next to the speaker 25. The photodetector 1 is disposed in the housing 22 such that it faces the lens window 26. A microphone 27 is disposed in one lateral side of the housing 22 near the operation buttons 24. The microphone 27 receives voice sounds during a telephone call and can be also used as a microphone for recording.

Since the smartphone 21 includes the photodetector 1 capable of advantageously reducing the sensitivity of an infrared wavelength range, it is possible to provide the lens window 26 for light reception which is formed in the smartphone 21 and has a practicable low visible light transmittance. As a result, it is possible to extend a degree of freedom of design (e.g., change in color, shape and the like) of the lens window 26. Although the present disclosure has been described in the above by way of embodiments, the present disclosure may be practiced in different forms.

For example, although it has been illustrated in the above embodiments that the arithmetic operation part 4 is provided as a part of the photodetector 1, the signal separation process by the arithmetic operation part 4 may be performed by a logic circuit (CPU or any suitable part of the electronic apparatus) in the outside of the photodetector 1. While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A photodetector comprising:
a semiconductor substrate;
a first light receiving part for signal detection and a first infrared light receiving part which are formed in the semiconductor substrate and are covered at least by first color filters having a first common color;
a second light receiving part for signal detection and a second infrared light receiving part which are formed in the semiconductor substrate and are covered at least by second color filters having a second common color;
third color filters which overlap with the first color filters on the first infrared light receiving part and are configured to block light in a wavelength range transmitting through the first color filters; and
fourth color filters which overlap with the second color filters on the second infrared light receiving part and are configured to block light in a wavelength range transmitting through the second color filters.

2. The photodetector of claim 1, wherein each of the first and second light receiving parts for signal detection and the first and second infrared light receiving parts includes a first pn junction located at the same depth from a surface of the semiconductor substrate and a second pn junction located to be deeper than the first pn junction.

3. The photodetector of claim 1, wherein the first and second color filters include blue color filters or green color filters and the third and fourth color filters include red color filters.

4. The photodetector of claim 1, wherein the first and second color filters include red color filters and the third and fourth color filters include blue color filters or green color filters.

5. The photodetector of claim 1, wherein the first and second color filters include red color filters and the third and fourth color filters include blue color filters or green color filters, and
wherein each of the first and second light receiving parts for signal detection and the first and second infrared light receiving parts includes a first pn junction located at the same depth from a surface of the semiconductor substrate and a second pn junction located to be deeper than the first pn junction.

6. The photodetector of claim 1, further comprising an arithmetic operation part which is electrically connected to the first and second light receiving parts for signal detection and the first and second infrared light receiving parts and is configured to selectively exclude or attenuate an infrared wavelength range from an output signal of the first and second light receiving parts for signal detection based on a magnitude of an output signal of the first and second infrared light receiving part.

7. The photodetector of claim 1, wherein the first and second light receiving parts for signal detection are disposed at positions which are in point symmetry with respect to a center of a light receiving region on the semiconductor substrate.

8. The photodetector of claim 1, further comprising an infrared light cut filter configured to cover the first and second light receiving parts for signal detection and the first and second infrared light receiving parts.

9. The photodetector of claim 1, wherein each of the first to fourth color filters includes a color resist.

10. An electronic apparatus comprising:
the photodetector of claim 1; and
a housing configured to accommodate the photodetector.

11. The photodetector of claim 1, wherein the third color filters and the fourth color filters have a same color.

12. The photodetector of claim 1, wherein the first color filters and the fourth color filters have a same color, and the second color filters and the third color filters have a same color.

13. The photodetector of claim 12, wherein the first color filters entirely overlap the first light receiving part and the first infrared light receiving part.

14. The photodetector of claim 12, wherein the first color filters have a portion overlapping with the second color filters.

15. A photodetector comprising:
a semiconductor substrate;
a light receiving part for signal detection and an infrared light receiving part which are formed in the semiconductor substrate and are covered at least by first color filters having a common color; and
second color filters which overlap with the first color filters on the infrared light receiving part and are configured to block light in a wavelength range transmitting through the first color filters,
wherein the light receiving part for signal detection is disposed at positions which are in point symmetry with respect to a center of a light receiving region on the semiconductor substrate.

* * * * *